United States Patent [19]
Katoh

[11] Patent Number: 6,159,752
[45] Date of Patent: Dec. 12, 2000

[54] METHOD OF FORMING PARA-DIELECTRIC AND FERRO-DIELECTRIC CAPACITORS OVER A SILICON SUBSTRATE

[75] Inventor: Yuukoh Katoh, Tokyo, Japan

[73] Assignee: NEC Corporation, Tokyo, Japan

[21] Appl. No.: 09/436,721

[22] Filed: Nov. 9, 1999

Related U.S. Application Data

[62] Division of application No. 08/867,407, Jun. 2, 1997, abandoned.

[30] Foreign Application Priority Data

May 31, 1996 [JP] Japan .................................. 8-137894

[51] Int. Cl.$^7$ ....................................................... H01G 7/06
[52] U.S. Cl. ................................................ 438/3; 438/240
[58] Field of Search ................... 438/3, 240, 238, 438/281, 250–253, 393–396

[56] References Cited

U.S. PATENT DOCUMENTS

| | | |
|---|---|---|
| 4,044,222 | 8/1977 | Kestenbaum . |
| 4,437,139 | 3/1984 | Howard . |
| 4,894,115 | 1/1990 | Eichelberger et al. . |
| 5,422,513 | 6/1995 | Marcinkiewicz et al. . |
| 5,424,244 | 6/1995 | Zhang et al. . |
| 5,555,486 | 9/1996 | Kingon ..................................... 361/305 |
| 5,811,332 | 9/1998 | Chao . |

FOREIGN PATENT DOCUMENTS 60-116166   6/1985   Japan .

OTHER PUBLICATIONS

Nakao et al., "Electrical Properties of PZT Thim Films Derived From Sol–Gel solution Containing Photo–Sensitive Water–Generator", IEEE, 1995, pp. 450–453.

Jingping et al., "Preparation of $Pb(Zr,Ti)O_3$ Ferroelectric Thin Films by a Pulsed Laser Ablation Technique", IEEE, 1991, pp. 560–563.

*Primary Examiner*—Jey Tsai
*Attorney, Agent, or Firm*—Young & Thompson

[57] ABSTRACT

In a method of forming dielectric films over a substrate, a dielectric film having two parts, each with a first dielectric property, is formed and the first part of the dielectric film is subjected to a heat treatment to cause the first part of the dielectric film to have a second dielectric property different from the first dielectric property, while maintaining the first dielectric property of the second part.

20 Claims, 10 Drawing Sheets

11 : silicon substrate
13A : first bottom electrode
14 : PZT film
12 : silicon oxide film
13B : second bottom electrode 11 : silicon substrate
13A : first bottom electrode
14 : PZT film
12 : silicon oxide film
13B : second bottom electrode
15 : first PZT region 51 : silicon substrate
53A : first bottom electrode
54 : first dielectric film 52 : silicon oxide film
53B : second bottom electrode
55 : first top electrode 51 : silicon substrate
53A : first bottom electrode
54 : first dielectric film 52 : silicon oxide film
53B : second bottom electrode
55 : first top electrode 51 : silicon substrate
53A : first bottom electrode
54 : first dielectric film
56 : second dielectric film 52 : silicon oxide film
53B : second bottom electrode
55 : first top electrode
57 : second top electrode 51 : silicon substrate
53A : first bottom electrode
54 : first dielectric film
56 : second dielectric film 52 : silicon oxide film
53B : second bottom electrode
55 : first top electrode
57 : second top electrode 11 : silicon substrate
13A : first bottom electrode 12 : silicon oxide film
13B : second bottom electrode 11 : silicon substrate
13A : first bottom electrode
14 : PZT film 12 : silicon oxide film
13B : second bottom electrode 11 : silicon substrate
13A : first bottom electrode
14 : PZT film 12 : silicon oxide film
13B : second bottom electrode
15 : first PZT region 11 : silicon substrate
13A : first bottom electrode
15 : first PZT region
17 : second top electrodes 12 : silicon oxide film
13B : second bottom electrode
16 : second PZT region 21 : silicon substrate
22 : silicon oxide film
23 : platinum bottom electrode 21 : silicon substrate
23 : first bottom electrode
22 : silicon oxide film
24 : Ir/IrO$_2$ bottom electrode 21 : silicon substrate
23 : first bottom electrode
25 : PZT film 22 : silicon oxide film
24 : Ir/IrO$_2$ bottom electrode
26 : first PZT region 21 : silicon substrate
23 : first bottom electrode
26 : first PZT region 22 : silicon oxide film
24 : Ir/IrO$_2$ bottom electrode
27 : second PZT region 31 : silicon substrate
32 : silicon oxide film
33 : titanium bottom electrode
34 : platinum film 31 : silicon substrate
32 : silicon oxide film
33 : titanium bottom electrode
34 : platinum film
35A : first bottom electrode
35B : second bottom electrode 31 : silicon substrate
32 : silicon oxide film
33 : titanium bottom electrode
34 : platinum film
35A : first bottom electrode
35B : second bottom electrode
36 : PZT film
37 : first PZT region 31 : silicon substrate
32 : silicon oxide film
33 : titanium bottom electrode
34 : platinum film
35A : first bottom electrode
35B : second bottom electrode
37 : first PZT region
38 : second PZT region
39 : top electrodes 41 : silicon substrate
43 : platinum film
42 : silicon oxide film
44 : PZT film 41 : silicon substrate
43 : platinum film
45 : platinum top electrode
47 : first PZT region
42 : silicon oxide film
44 : PZT film
46 : gold top electrode 41 : silicon substrate
43 : platinum film
45 : platinum top electrode
47 : first PZT region 42 : silicon oxide film 46 : gold top electrode
48 : second PZT region

METHOD OF FORMING PARA-DIELECTRIC AND FERRO-DIELECTRIC CAPACITORS OVER A SILICON SUBSTRATE

CROSS-REFERENCE TO RELATED APPLICATIONS

This application is a division of application Ser. No. 08/867,407, filed Jun. 2, 1997 now abandoned.

BACKGROUND OF THE INVENTION

The present invention relates to a method of forming a para-dielectric and ferro-dielectric capacitors over a silicon substrate.

Dielectric films are used as a capacitive insulation film for capacitor in a semiconductor device. A dynamic random access memory has a plurality of pairs of a transistor and a capacitor. The capacitor has a capacitive insulation film which may be either a para-dielectric film or a ferro-dielectric film. The ferro-dielectric film used provides the capacitor with a non-volatile function. The para-dielectric film is essential for processing analog signals. In the above circumstances, it is required to locally and selectively form the para-dielectric film and the ferro-dielectric film over a single silicon substrate.

A conventional method of forming the para-dielectric film and the ferro-dielectric film over a single silicon substrate locally and selectively over a single silicon substrate will be described with reference to FIGS. 1A through 1D.

With reference to FIG. 1A, a silicon oxide film 52 is entirely formed on a silicon substrate 51. A conductive film is also entirely formed on the silicon oxide film 52. The conductive film is patterned by a photolithography and subsequent dry etching process thereby to form first and second bottom electrodes 53A and 53B on different regions of the silicon oxide film 52. A first dielectric film 54 is entirely deposited, which extends over the first and second bottom electrodes 53A and 53B and the silicon oxide film 52. The first dielectric film 54 may be deposited by either a sputtering method or a chemical vapor deposition method. A first top electrode 55 is selectively formed on the first dielectric film 54 over the first bottom electrode 53A.

With reference to FIG. 1B, the first dielectric film 54 is selectively etched by use of the first top electrode 55 as a mask so that the first dielectric film 54 remains only under the first top electrode 55 and over the first bottom electrode 53A. The remaining part of the first dielectric film 54 serves as a capacitive insulation film for a first capacitor which comprises laminations of the first bottom electrode 53A, the first dielectric film 54 and the first top electrode 55.

With reference to FIG. 2C, a second dielectric film 56 is entirely formed, which extends over the first top electrode 55, the second bottom electrode 53B and the silicon oxide film 52. A second top electrode 57 is selectively formed on the second dielectric film 56 over the second bottom electrode 53B.

With reference to FIG. 2D, the second dielectric film 56 is selectively etched by use of the second top electrode 57 as a mask so that the second dielectric film 56 remains only under the second top electrode 57 and over the second bottom electrode 53B. The remaining part of the second dielectric film 56 serves as a second capacitive insulation film for a second capacitor which comprises laminations of the second bottom electrode 53B, the second dielectric film 56 and the second top electrode 57.

As described above, the first capacitive insulation film in the first capacitor may be different in dielectric substance from the second capacitive insulation film in the second capacitor. If, for example, the first capacitive insulation film is a para-dielectric film and the second capacitive insulation film is a ferro-dielectric film, then the first capacitor serves as a capacitor for processing analog signals and the second capacitor has a non-volatile function to serve as a memory capacitor. The above conventional method has the following three problems.

The first problem is concerned with an increased number of processes for manufacturing different kinds of capacitors. Namely, the different kinds of capacitors are separately formed in different fabrication processes. This results in an increased time for manufacturing the capacitors.

The second problem is concerned with limitation to available methods of forming the layers for the second capacitor. When the second capacitor is formed, the step has already been formed, for which reason it is difficult to use the methods sensitive to the steps such as the sol-gel method.

The third problem is concerned with that variation in property or characteristic of the first dielectric film is caused when the second capacitor is formed. If, for example, the first dielectric film is formed at a temperature of 400° C. and the second dielectric film is formed at a temperature of 600° C. this means that the first dielectric film already formed is heated at the higher temperature of 600° C. when the second dielectric film is formed. As a result, the first dielectric film varies in structure and constitutional elements of the first dielectric film may be diffused into exterior whereby the characteristic is changed.

In the above circumstances, it has been required to develop a novel method of forming different kinds of capacitors locally and selectively over a single silicon substrate with no change in characteristic and nor increase in the number of fabrication processes.

SUMMARY OF THE INVENTION

Accordingly, it is an object of the present invention to provide a novel method of forming different kinds of capacitors locally and selectively over a single silicon substrate, which is free from the above problems.

It is a further object of the present invention to provide a novel method of forming different kinds of capacitors locally and selectively over a single silicon substrate with no change in characteristic and nor increase in the number of fabrication processes.

It is a further more object of the present invention to provide a novel method of forming different kinds of capacitive insulation films locally and selectively over a single silicon substrate, which is free from the above problems.

It is a still further object of the present invention to provide a novel method of forming different kinds of capacitive insulation films locally and selectively over a single silicon substrate with no change in characteristic and nor increase in the number of fabrication processes.

The above and other objects, features and advantages of the present invention will be apparent from the following descriptions.

The present invention provides a method of forming dielectric films over a substrate. The method comprises the following steps. A dielectric film having a first dielectric property is formed. A part of the dielectric film is subjected to a heat treatment to cause the part of the dielectric film to have a second dielectric property different from the first dielectric property.

The present invention provides a method of forming dielectric films over a substrate. The method comprises the following steps. A dielectric film is formed which extends in contact with both a first conductive film and a second conductive film different from the first conductive film. The dielectric film is subjected to a heat treatment so that the dielectric film in contact with the first conductive film is made into a first dielectric region which has a first dielectric property whilst the dielectric film in contact with the second conductive film is made into a second dielectric region which has a second dielectric property which is different from the first dielectric property.

BRIEF DESCRIPTIONS OF THE DRAWINGS

Preferred embodiments according to the present invention will be described in detail with reference to the accompanying drawings.

FIGS. 5A through 5D are fragmentary cross sectional elevation views illustrative of a pair of para-dielectric capacitor and ferro-dielectric capacitor formed over a single silicon substrate in sequential steps involved in a novel fabrication method of a fourth embodiment according to the present invention.

DISCLOSURE OF THE PRESENT INVENTION

Figure 1A:
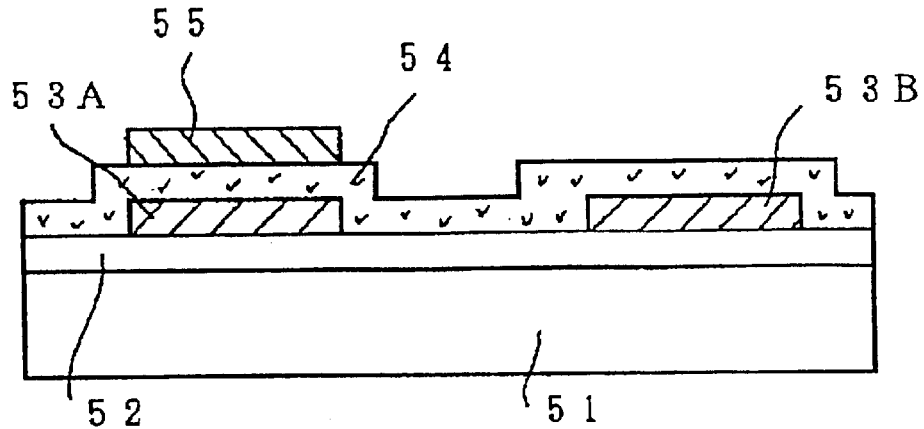
FIGS. 1A through 1D are fragmentary cross sectional elevation views illustrative of a pair of para-dielectric capacitor and ferro-dielectric capacitor formed over a single silicon substrate in sequential steps involved in the conventional fabrication method.
Figure 1B:
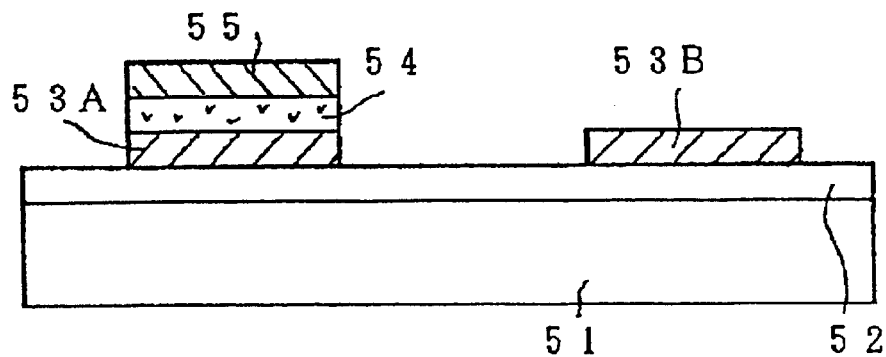
Figure 1C:
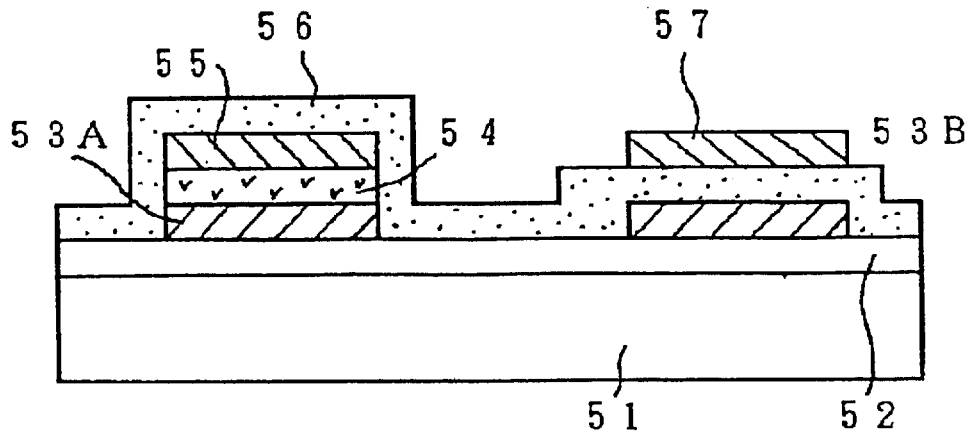
Figure 1D:
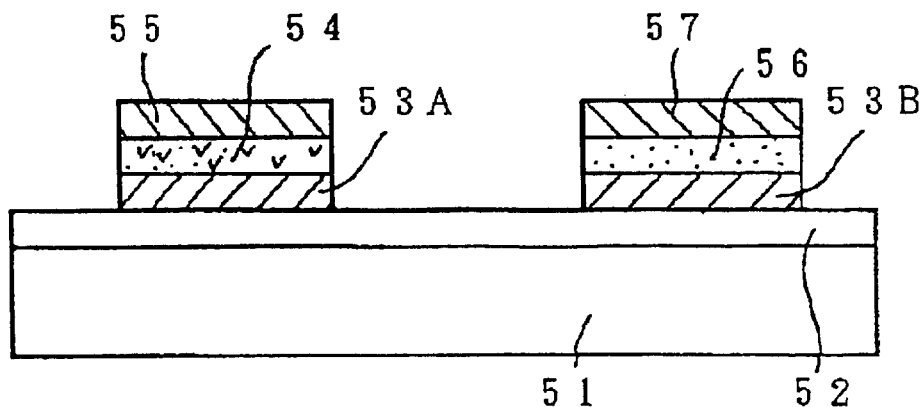

The present invention provides a method of forming dielectric films over a substrate. The method comprises the following steps. A dielectric film having a first dielectric property is formed. A part of the dielectric film is subjected to a heat treatment to cause the part of the dielectric film to have a second dielectric property different from the first dielectric property.

It is preferable that the heat treatment is carried out to irradiate a laser beam onto the part of the dielectric film.

The present invention provides a method of forming dielectric films over a substrate. The method comprises the following steps. A dielectric film is formed which extends in contact with both a first conductive film and a second conductive film different from the first conductive film. The dielectric film is subjected to a heat treatment so that the dielectric film in contact with the first conductive film is made into a first dielectric region which has a first dielectric property whilst the dielectric film in contact with the second conductive film is made into a second dielectric region which has a second dielectric property which is different from the first dielectric property.

It is preferable that each of the first and second conductive films comprises a single layered structure.

It is also preferable that the first conductive film comprises lamination structures of different conductive films whilst the second conductive film comprises a single layered structure.

It is also preferable that the dielectric film extends over the first ad second conductive films.

It is also preferable that the dielectric film extends under the first and second conductive films.

The present invention provides a method of forming first and second capacitors having different capacitive dielectric films over a silicon substrate. The method comprises the following steps. A silicon oxide film is formed over the silicon substrate. First and second bottom electrode layers are selectively and separately formed on the silicon oxide film, wherein the first and second bottom electrode layers are made of the same conductive material. A dielectric film is formed which extends over the first and second bottom electrode layers and the silicon oxide film. The dielectric film only on the first bottom electrode layer is selectively subjected to a heat treatment so that the dielectric film only on the first bottom electrode layer is made into a different dielectric film region differing in dielectric property from the dielectric film. The dielectric film is selectively removed to have the dielectric film remain only over the second bottom electrode layer. Top electrodes are selectively formed on the different dielectric film and the remaining dielectric film.

It is also preferable that the heat treatment is carried out to irradiate a laser beam onto the dielectric film.

The present invention also provides a method of forming first and second capacitors having different capacitive dielectric films over a silicon substrate. The method comprises the following steps. A silicon oxide film is formed over the silicon substrate. First and second bottom electrode layers are selectively and separately formed on the silicon oxide film, wherein the first and second bottom electrode layers are made of different conductive materials. A dielectric film is formed which extends over the first and second bottom electrode layers and the silicon oxide film. The dielectric film is subjected to a heat treatment so that the dielectric film on the first bottom electrode layer is made into a first dielectric film region having a first dielectric property whilst the dielectric film on the second bottom electrode layer is made into a second dielectric film region having a second dielectric property different from the first dielectric property. The dielectric film is selectively removed except for the first and second dielectric film regions. Top electrodes are selectively formed on the first and second dielectric film regions.

The present invention also provides a method of forming first and second capacitors having different capacitive dielectric films over a silicon substrate. The method comprises the following steps. A silicon oxide film is formed over the silicon substrate. First and second bottom electrode layers are selectively and separately formed on the silicon oxide film, wherein the first bottom electrode layer comprises laminations of first and second conductive films made of different conductive materials, whilst the second bottom electrode layer comprises the second conductive film. A dielectric film is formed which extends over the first and second bottom electrode layers and the silicon oxide film. The dielectric film is subjected to a heat treatment so that the dielectric film on the first bottom electrode layer is made into a first dielectric film region having a first dielectric property whilst the dielectric film on the second bottom electrode layer is made into a second dielectric film region having a second dielectric property different from the first dielectric property. The dielectric film is selectively removed except for the first and second dielectric film regions. Top electrodes are selectively formed on the first and second dielectric film regions.

The present invention also provides a method of forming first and second capacitors having different capacitive dielectric films over a silicon substrate. The method comprises the following steps. A silicon oxide film is formed over the silicon substrate. A first conductive film is formed over the silicon oxide film. A dielectric film is formed over the first conductive film. First and second top electrode layers are selectively and separately formed on the dielectric film, wherein the first and second top electrode layers are made of different conductive materials. The dielectric film is subjected to a heat treatment so that the dielectric film in contact with the first top electrode layer is made into a first dielectric film region having a first dielectric property whilst the dielectric film in contact with the second top electrode layer is made into a second dielectric film region having a second dielectric property different from the first dielectric property. The dielectric film is selectively removed except for the first and second dielectric film regions.

PREFERRED EMBODIMENTS

First Embodiment

A first embodiment according to the present invention will be described in detail with reference to FIGS. 2A through 2D illustrative of a pair of para-dielectric capacitor and ferro-dielectric capacitor formed over a single silicon substrate in sequential steps involved in a novel fabrication method of a this embodiment according to the present invention.

Figure 2A:
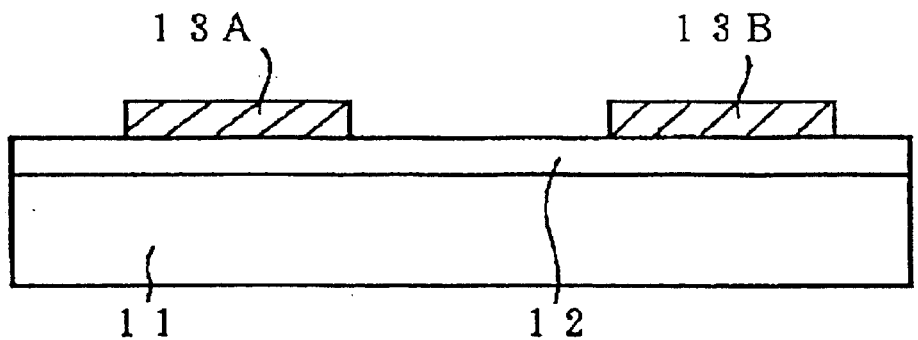
FIGS. 2A through 2D are fragmentary cross sectional elevation views illustrative of a pair of para-dielectric capacitor and ferro-dielectric capacitor formed over a single silicon substrate in sequential steps involved in a novel fabrication method of a first embodiment according to the present invention.

With reference to FIG. 2A, a silicon oxide film 12 is entirely formed on a silicon substrate 11. A platinum film is also entirely formed on the silicon oxide film 12. The platinum film is patterned by a photolithography and subsequent dry etching process thereby to form first and second bottom electrodes 13A and 13B on different regions of the silicon oxide film 12.

Figure 2B:
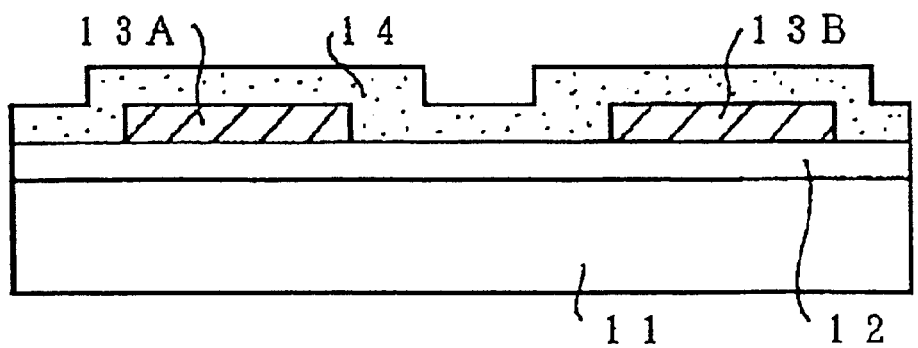

With reference to FIG. 2B, a PZT film 14 as a ferro-dielectric film is entirely spin-coated by a sol-gel method and then burned at 650° C. so that the PZT film 14 extends over the first and second bottom electrodes 13A and 13B and the silicon oxide film 12.

Figure 2C:
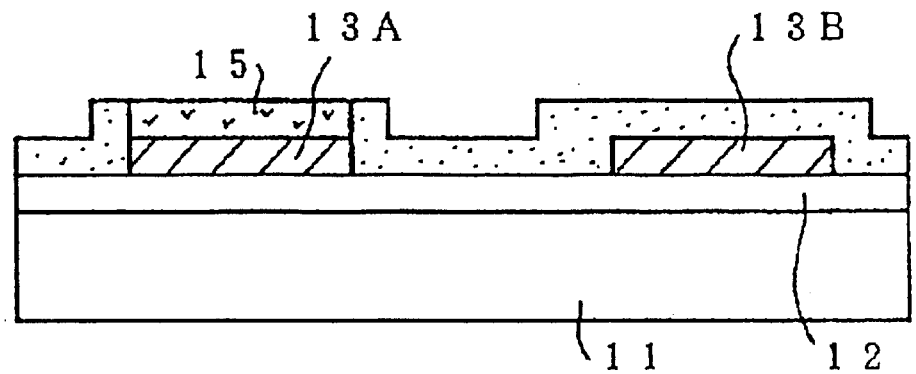

With reference to FIG. 2C, a laser beam is selectively irradiated onto a first PZT region 15 over a the first bottom electrode 13A to enlarge the size of grains of the first PZT region 15. The first PZT region 15 having large grain size is different in characteristic from the PZT film 14.

Figure 2D:
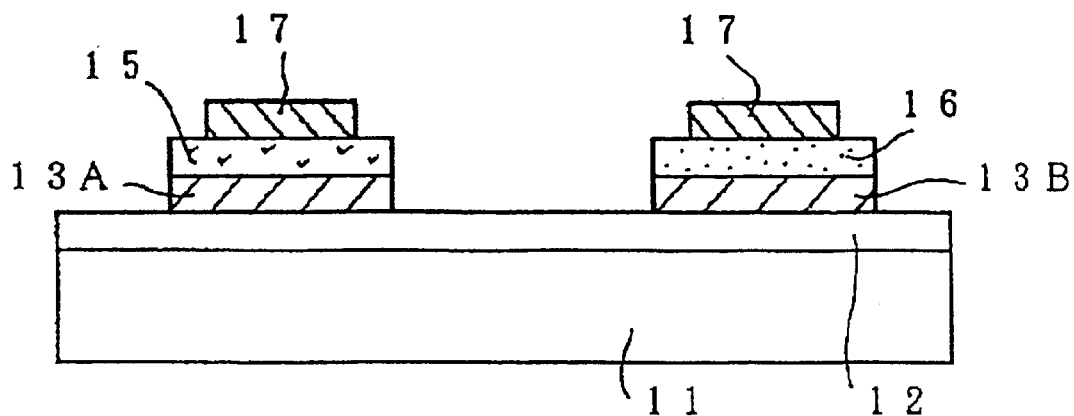

With reference to FIG. 2D, another platinum film is formed which extends over the PZT film 14 and the first PZT region 15. The other platinum film is patterned by photolithography and subsequent dry etching to form top electrodes 17 on the first PZT region 15 and on the PZT film 14 over the second bottom electrode 13B. The PZT film 14 is selectively etched so that the PZT film 14 remains only over the second bottom electrode 13B. As a result, the remaining part of the PZT film 14 serves as a second capacitive insulator 16. The first PZT region 15 serves as a first capacitive insulator 15. The first capacitive insulator 15 is larger in grain size than the second capacitive insulator 16, for which reason the first capacitive insulator 15 is different in characteristic from the second capacitive insulator 16. As a result, the first and second capacitors having the capacitive dielectric films 26 and 27 differing in characteristic from each other are formed.

Second Embodiment

A second embodiment according to the present invention will be described in detail with reference to FIGS. 3A through 3D illustrative of a pair of para-dielectric capacitor and ferro-dielectric capacitor formed over a single silicon substrate in sequential steps involved in a novel fabrication method of a this embodiment according to the present invention.

Figure 3A:
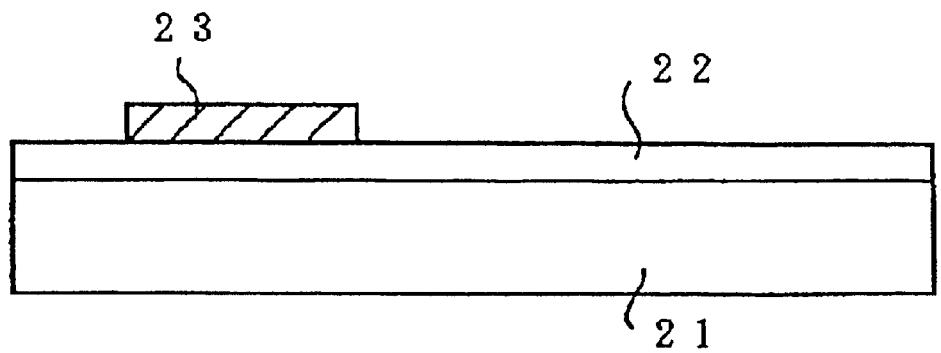
FIGS. 3A through 3D are fragmentary cross sectional elevation views illustrative of a pair of para-dielectric capacitor and ferro-dielectric capacitor formed over a single silicon substrate in sequential steps involved in a novel fabrication method of a second embodiment according to the present invention.

With reference to FIG. 3A, a silicon oxide film 22 is formed over a silicon substrate 21. A platinum film is entirely formed, which extends over the silicon oxide film 22. The platinum film is then patterned to selectively form a platinum bottom electrode 23 on the silicon oxide film 22.

Figure 3B:
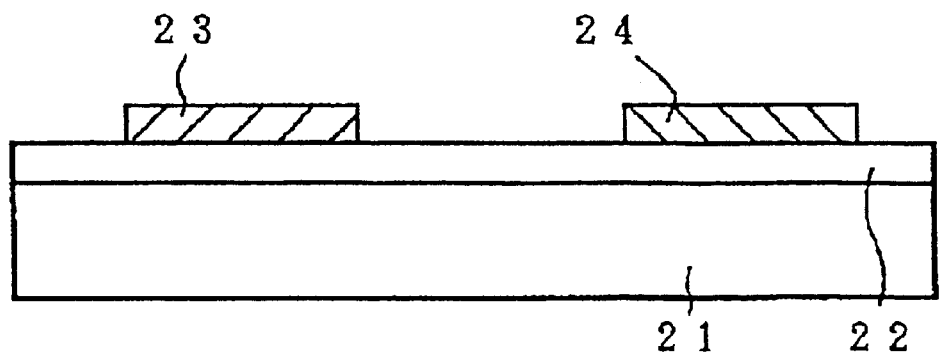

With reference to FIG. 3B, an Ir/IrO$_2$ film is entirely deposited by a sputtering method so that the Ir/IrO$_2$ film extends over the platinum bottom electrode 23 and the silicon oxide film 22. The Ir/IrO$_2$ film is then patterned to form an Ir/IrO$_2$ bottom electrode 24 on a different region of the silicon oxide film 22 form the platinum bottom electrode 23.

Figure 3C:
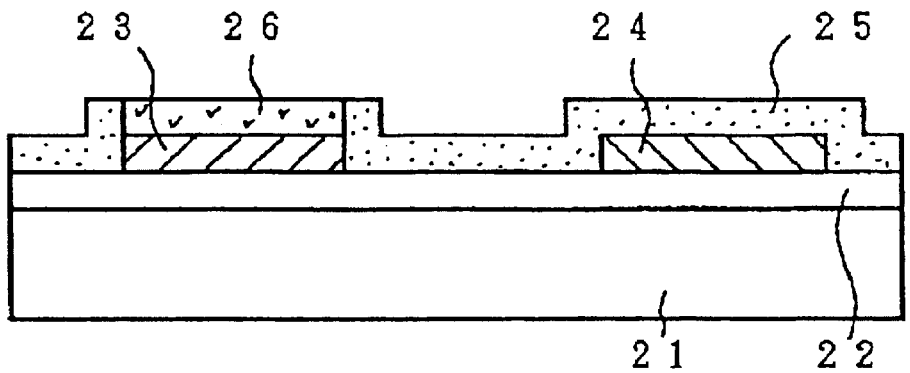

With reference to FIG. 3C, a PZT film 25 is entirely spin-coated by a sol-gel method so that the PZT film 25 extends over the platinum bottom electrode 23 and the Ir/IrO$_2$ bottom electrode 24. The PZT film 25 is burned at 650° C. so that the PZT film 25 over the platinum bottom electrode 23 is made into a first PZT region 26 differing in characteristic from the PZT film 25, whilst the PZT film 25 over the Ir/IrO$_2$ bottom electrode 24 is made into a second PZT region 27 differing in characteristic from the first PZT region 26. The PZT film 25 is selectively etched to leave the second PZT region 27 only over the Ir/IrO$_2$ bottom electrode 24.

Figure 3D:
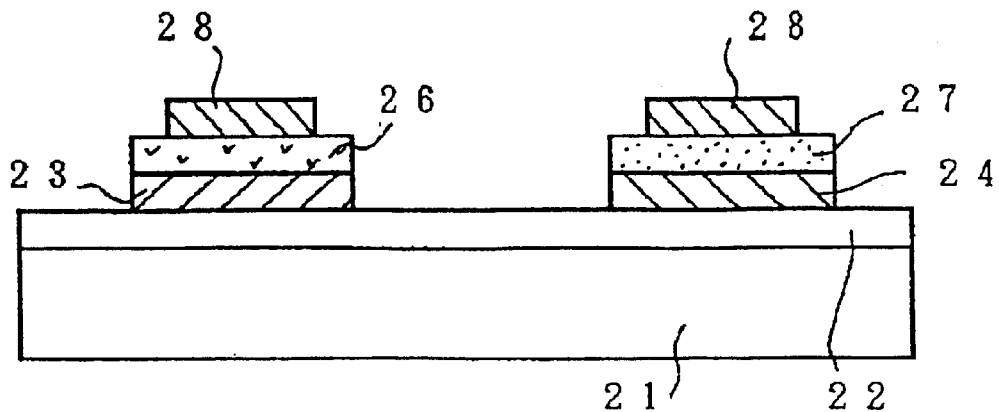

With reference to FIG. 3D, a platinum film is selectively formed over the first PZT region 26 and the second PZT region 27 to form top electrodes 28 on the first PZT region 26 and the second PZT region 27. As a result, the first and second capacitors having the capacitive dielectric films 26 and 27 differing in characteristic from each other are formed.

As a modification, it is possible to use a polysilicon film in place of the Ir/IrO$_2$ film so that a part of the polysilicon film is oxidized into a silicon oxide film during formation of the PZT film 25. As a result, laminations of the PZT film and the silicon oxide film are formed whereby it is possible to make extremely small the dielectric constant of the dielectric film over the polysilicon.

Third Embodiment

A third embodiment according to the present invention will be described in detail with reference to FIGS. 4A through 4D illustrative of a pair of para-dielectric capacitor and ferro-dielectric capacitor formed over a single silicon substrate in sequential steps involved in a novel fabrication method of a this embodiment according to the present invention.

Figure 4A:
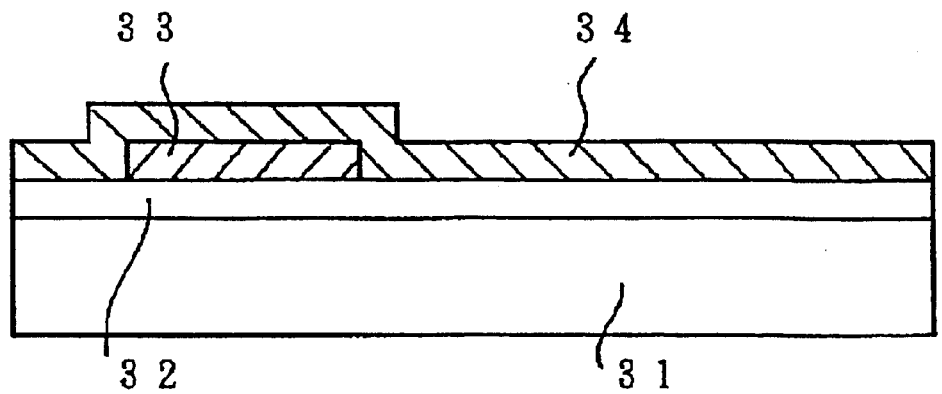
FIGS. 4A through 4D are fragmentary cross sectional elevation views illustrative of a pair of para-dielectric capacitor and ferro-dielectric capacitor formed over a single silicon substrate in sequential steps involved in a novel fabrication method of a third embodiment according to the present invention.

With reference to FIG. 4A, a silicon oxide film 32 is formed over a silicon substrate 31. A titanium film is entirely deposited over the silicon oxide film 32. The titanium film is then patterned by a photo-lithography and subsequent dry etching to selectively form a titanium bottom electrode 33 on the silicon oxide film 32. A platinum film 34 is entirely deposited, which extends over the titanium bottom electrode 33 and the silicon oxide film 32.

Figure 4B:
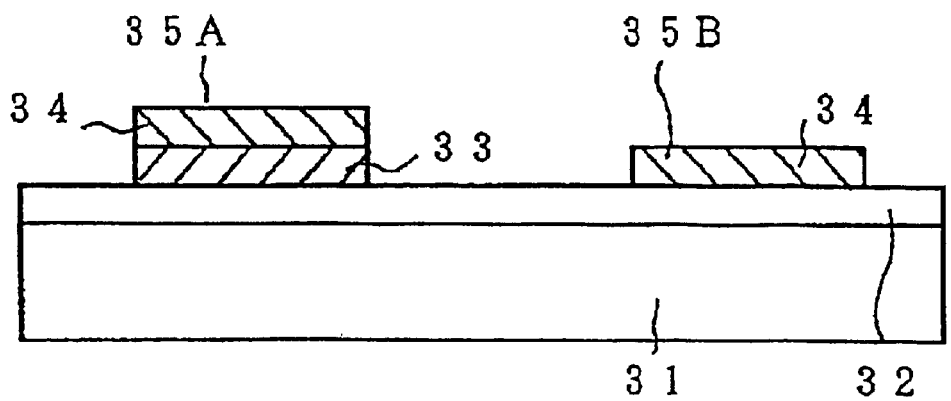

With reference to FIG. 4B, the platinum film 34 is patterned to leave the platinum films 34 over the titanium bottom electrode 33 and on a region of the silicon oxide film 32. As a result, a first bottom electrode 35A comprising laminations of the titanium bottom electrode 33 and the platinum film 34 and a second bottom electrode 35B comprising the platinum film 34 are formed.

Figure 4C:
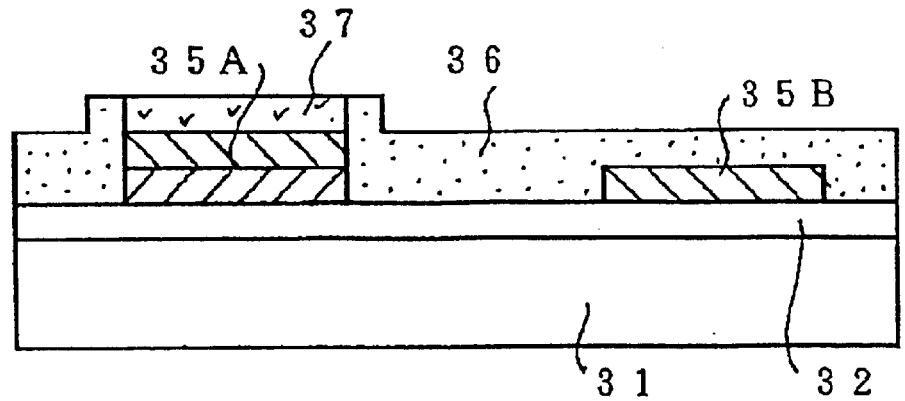

With reference to FIG. 4C, a PZT film 36 is entirely spin-coated by a sol-gel method so that the PZT film 36 extends over the first and second bottom electrodes 35A and 35B. The PZT film 36 is then burned so that the PZT film 36 over the first bottom electrode 35A is made into a first PZT region 37 differing in characteristic from the PZT film 36.

Figure 4D:
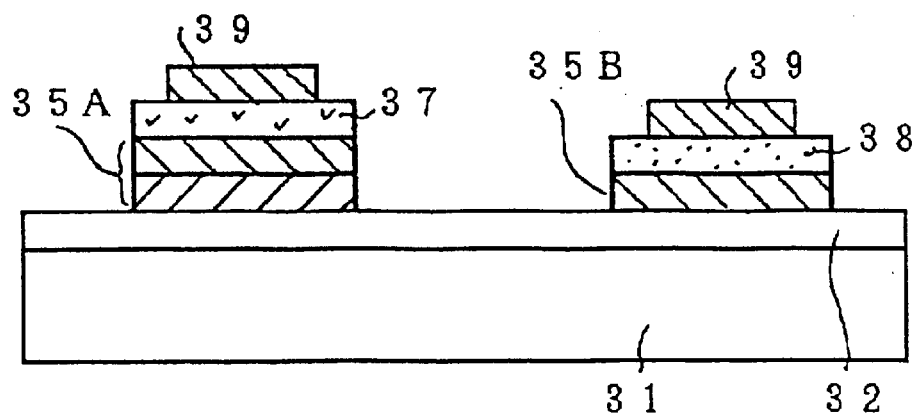

With reference to FIG. 4D, the PZT film 36 is selectively etched to have the PZT film 36 remain over the second bottom electrode 35B. As a result, a second PZT region 38 is formed over the second bottom electrode 35B. The second PZT region 38 differs in characteristic from the first PZT region 37. The second PZT region 38 serves as a second capacitive insulation film whilst the first PZT region 37 serves as a first capacitive insulation film 37. Platinum top electrodes 39 are selectively formed on the first and second PZT regions 37 and 38. As a result, the first and second capacitors having the capacitive dielectric films 37 and 38 differing in characteristic from each other are formed.

As a modification, it is possible to deposit laminations of a PbTiO$_3$ film and a PZT film as the capacitive dielectric film in place of the single PZT film 36. In this case, it is also possible that the first and second capacitors having the capacitive dielectric films 37 and 38 differing in characteristic from each other are formed and also possible to reduce the dielectric constants of the capacitive dielectric films 37 and 38.

Fourth Embodiment

Figure 5A:
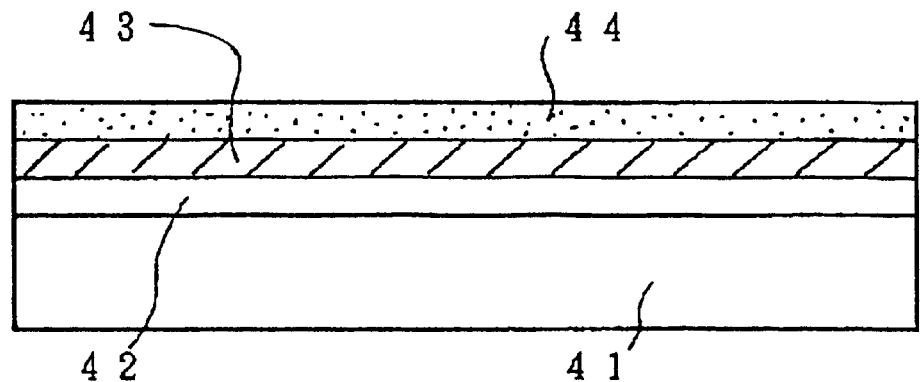
Figure 5B:
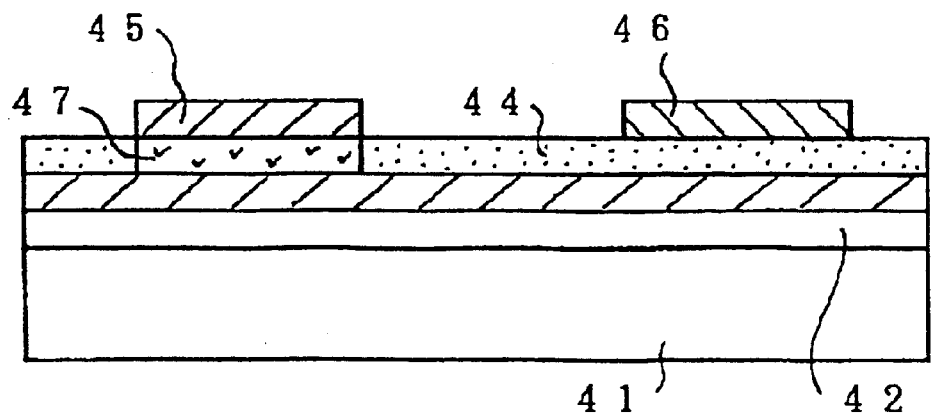
Figure 5C:
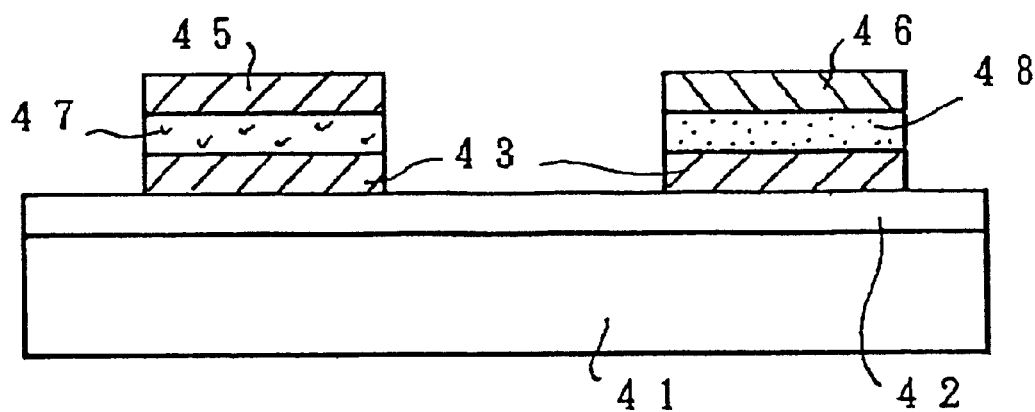

A fourth embodiment according to the present invention will be described in detail with reference to FIGS. 5A through 5C illustrative of a pair of para-dielectric capacitor and ferro-dielectric capacitor formed over a single silicon substrate in sequential steps involved in a novel fabrication method of a this embodiment according to the present invention.

With reference to FIG. 5A, a silicon oxide film 42 is formed over a silicon substrate 41. A platinum film 43 is entirely deposited over the silicon oxide film 42 by sputtering a platinum target. A PZT film 44 is entirely deposited over the platinum film 43 by sputtering a PZT target.

With reference to FIG. 5B, another platinum film is entirely deposited over the PZT film 44 by sputtering a platinum target. The other platinum film is then patterned by a photo-lithography and subsequent dry etching to selectively form a platinum top electrode 45 on the PZT film 44. A gold film is entirely deposited over the PZT film 44 by sputtering a gold target. The gold film is then patterned by a photo-lithography and subsequent dry etching to selectively form a gold top electrode 46 on a different region of the PZT film 44. The PZT film 44 under the platinum top electrode 45 is made into the first PZT region 47 differing in characteristic from the PZT film 44 by a heat treatment carried out to form the platinum top electrode 45 and the gold top electrode 46.

With reference to FIG. 5C, the PZT film 44 and the platinum film 43 are selectively etched so that laminations of a second PZT region 48 and the platinum film 43 remain under the gold top electrode 46 while the laminations of the first PZT region 47 and the platinum film 43 remain under the platinum top electrode 45. The second PZT region 48 differs in characteristic from the first PZT region 47. As a result, the first and second capacitors having the capacitive dielectric films 47 and 48 differing in characteristic from each other are formed.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims any modifications of the present invention which fall within the spirit and scope of the present invention.

What is claimed is:

1. A method of forming dielectric films over a substrate, said method comprising the steps of:

forming a dielectric film which extends in contact with both a first conductive film and a second conductive film different from said first conductive film;

subjecting said dielectric film to a heat treatment so that said dielectric film in contact with said first conductive film is made into a first dielectric region which has a first dielectric property whilst said dielectric film in contact with said second conductive film is made into a second dielectric region which has a second dielectric property which is different from said first dielectric property.

2. The method as claimed in claim 1, wherein each of said first and second conductive films comprises a single layered structure.

3. The method as claimed in claim 1, wherein said dielectric film extends over said first and second conductive films.

4. The method as claimed in claim 1, wherein said dielectric film comprises a PZT film.

5. The method as claimed in claim 1, wherein said first conductive film comprises a platinum film.

6. The method as claimed in claim 1, wherein said second conductive film comprises one of an Ir/IrO$_2$ film and a polysilicon film.

7. The method as claimed in claim 1, wherein the heat treatment heats the dielectric film to about 650° C.

8. The method as claimed in claim 1, wherein said dielectric film comprises a PZT film, said first conductive film comprises a platinum film, said second conductive film comprises one of an Ir/IrO$_2$ film and a polysilicon film, and the heat treatment heats the dielectric film to about 650° C.

9. The method as claimed in claim 1, further comprising the step of removing the dielectric film not in the first and second dielectric regions.

10. The method as claimed in claim 1, wherein said first conductive film comprises lamination structures of different conductive films whilst said second conductive film comprises a single layered structure.

11. The method as claimed in claim 10, wherein said first conductive film comprises a platinum film on a titanium film and said second conductive film comprises a platinum film.

12. A method of forming first and second capacitors having different capacitive dielectric films over a silicon substrate, said method comprising the steps of:

forming a silicon oxide film over said silicon substrate;

selectively forming first and second bottom electrode layers separately on said silicon oxide film, wherein said first and second bottom electrode layers are made of different conductive materials;

forming a dielectric film which extends over said first and second bottom electrode layers and said silicon oxide film;

subjecting said dielectric film to a heat treatment so that said dielectric film on said first bottom electrode layer is made into a first dielectric film region having a first dielectric property whilst said dielectric film on said second bottom electrode layer is made into a second dielectric film region having a second dielectric property different from said first dielectric property;

selectively removing said dielectric film except for said first and second dielectric film regions; and selectively forming top electrodes on said first and second dielectric film regions.

13. The method as claimed in claim 12, wherein each of said first and second bottom electrodes comprises a single layer structure.

14. The method as claimed in claim 12, wherein said dielectric film comprises a PZT film.

15. The method as claimed in claim 12, wherein said first bottom electrode comprises a platinum film.

16. The method as claimed in claim 12, wherein said second bottom electrode comprises one of an Ir/IrO$_2$ film and a polysilicon film.

17. The method as claimed in claim 12, wherein the heat treatment heats the dielectric film to about 650° C.

18. The method as claimed in claim 12, wherein said dielectric film comprises a PZT film, said first bottom electrode comprises a platinum film, said second bottom electrode comprises one of an Ir/IrO$_2$ film and a polysilicon film, and the heat treatment heats the dielectric film to about 650° C.

19. The method as claimed in claim 12, wherein said first bottom electrode comprises a lamination structure of different conductive films and second bottom electrode comprises a single layer structure.

20. The method as claimed in claim 19, wherein said first bottom electrode comprises a platinum film on a titanium film and said second bottom electrode comprises a platinum film.

* * * * *